(12) United States Patent
Choi

(10) Patent No.: US 7,476,592 B2
(45) Date of Patent: Jan. 13, 2009

(54) METHOD FOR MANUFACTURING SEMICONDUCTOR DEVICE

(75) Inventor: Kee Joon Choi, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/646,894

(22) Filed: Dec. 27, 2006

(65) Prior Publication Data

US 2007/0152293 A1   Jul. 5, 2007

(30) Foreign Application Priority Data

Dec. 29, 2005   (KR) ...................... 10-2005-0133185

(51) Int. Cl.
*H01L 21/336* (2006.01)
(52) U.S. Cl. .................. 438/297; 438/257; 438/264; 438/266; 438/267
(58) Field of Classification Search ......... 438/256–267, 438/199, 210, 224, 294, 197, 297, 238; 257/314–324
See application file for complete search history.

(56) References Cited

U.S. PATENT DOCUMENTS

| | | | |
|---|---|---|---|
| 7,205,630 B2* | 4/2007 | Chang et al. | ................. 257/500 |
| 2005/0130365 A1* | 6/2005 | Noda et al. | ................. 438/216 |
| 2006/0194438 A1* | 8/2006 | Rao et al. | ................... 438/720 |

* cited by examiner

*Primary Examiner*—Fernando L Toledo
*Assistant Examiner*—Jae Lee
(74) *Attorney, Agent, or Firm*—Andrew D. Fortney

(57) ABSTRACT

A semiconductor device is provided. The semiconductor device according to the present invention includes a semiconductor substrate, a second insulation layer, a buffer insulation layer adjacent to the second insulation layer, a third insulation layer and transistors. A high voltage device region and a low voltage device region are defined in the semiconductor substrate. The second and third insulation layers are formed in the high and low voltage device regions, respectively. The transistors are formed on the second and third insulation layers, respectively.

16 Claims, 3 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

In a semiconductor product such as a liquid crystal display device drive integrated circuit (LDI), a source drive integrated circuit (IC) requires a dual gate process of a high voltage (HV) and a low voltage (LV), and a gate driver IC requires a triple gate process.

The dual gate process is divided into a process step for forming an HV device region and a process step for forming an LV device region.

To begin with, a first oxide layer is formed on an entire surface of a substrate to form an oxide layer in an HV device region. A portion of the first oxide layer formed in an LV device region is removed so as to form an oxide layer in the LV device region. A second oxide layer is formed thinner than the first oxide layer in the LV device region. After that, a process for forming a gate electrode and source/drain electrodes in respective device regions is performed.

The HV device region is formed by thermal oxidation of a first oxide layer to uniformly reduce a hump and improve a threshold voltage, $V_t$. And a portion of the first oxide layer formed in the LV device region is removed because a thinner oxide layer is required in the LV device region than in the HV device region.

However, the removing of the portion of the first oxide layer formed in the LV device region may cause damage to a substrate, particularly to a shallow trench isolation (STI), and thus it may cause a problem of a current leakage.

Further, when a process for forming a silicide in an HV and an LV device region is performed, an oxide layer has a different thickness in the HV device region than in the LV device region. The thickness difference may cause damage to the relatively thin LV device region in the substrate, and thus it may cause a current leakage in the LV device region.

SUMMARY OF THE INVENTION

Accordingly, the present invention is directed to a method for manufacturing a semiconductor device that substantially obviates one or more problems due to limitations and disadvantages of the related art.

An object of the present invention is to provide a method for manufacturing a semiconductor device capable of forming a dual gate in an HV and an LV device region without causing any damage.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a method for forming a semiconductor device, the method including: sequentially depositing a buffer insulation layer and a first insulation layer on a semiconductor substrate in which a high voltage device region and a low voltage device region are defined; removing a portion of the buffer and first insulation layers to expose a portion of the high voltage device region; forming a second insulation layer thicker than the buffer insulation layer in the portion of the high voltage device region; selectively removing the first and buffer insulation layers such that the second insulation layer and a portion of the buffer insulation layer adjacent to the second insulation layer in the high voltage device region remain; forming a third insulation layer thinner than the first insulation layer in a region where the first and buffer insulation layers have been selectively removed; and forming transistors on the second and third insulation layers in the high and low voltage device regions, respectively.

In another aspect of the present invention, there is provided a semiconductor device including: a semiconductor substrate in which a high voltage device region and a low voltage device region are defined; a second insulation layer formed in the high voltage device region and a buffer insulation layer adjacent to the second insulation layer; a third insulation layer formed in the low voltage device region; and transistors respectively formed on the second and third insulation layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 1A to 1I are cross-sectional views illustrating a method for manufacturing a semiconductor device according to an embodiment of the present invention.

Figure 1A:
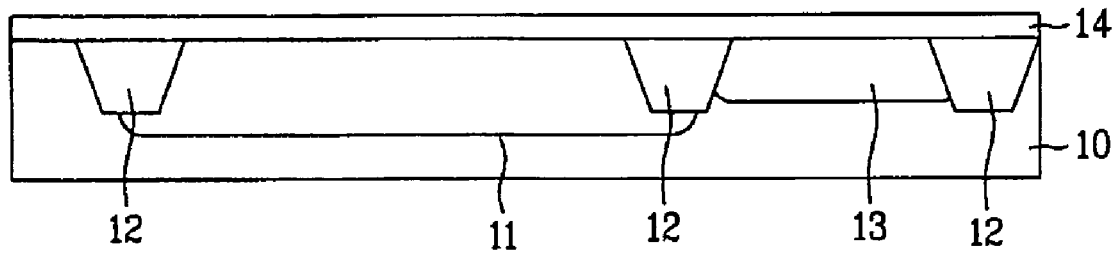
FIGS. 1A to 1I are cross-sectional views illustrating a method for manufacturing a semiconductor device according to an embodiment of the present invention.

Referring to FIG. 1A, an HV device forming region (hereinafter referred to as a first region), an LV device forming region (hereinafter referred to as a second region), an active region and an isolation region are defined in a semiconductor substrate 10.

Ions are implanted in the first region of the semiconductor substrate 10 using a first mask to form a first well 11.

After shallow trenches are formed in each boundary and isolation regions of the first and second regions, an insulation layer is deposited and planarized on an entire surface of the semiconductor substrate 10 to form isolation layers 12 in the shallow trenches.

Ions are implanted in the second region of the semiconductor substrate 10 using a second mask to form a second well 13.

Afterward, a buffer insulation layer 14 is formed to a thickness of 100~200 Å on a semiconductor substrate 10, in which the first and second wells 11 and 13 and the isolation layer 12 are formed. The buffer insulation layer 14 is an oxide layer formed using a thermal oxidation process.

Figure 1B:
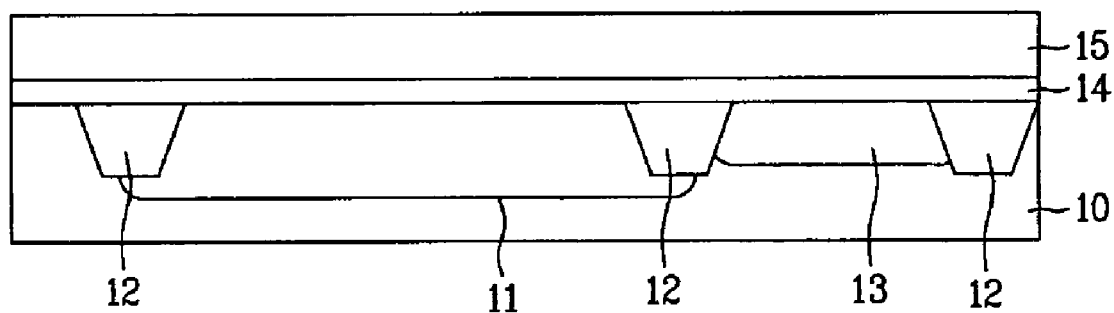

Referring to FIG. 1B, a first insulation layer 15 is formed to a thickness of 450~550 Å on the buffer insulation layer 14. The first insulation layer 15 is formed of silicon nitride.

Figure 1C:
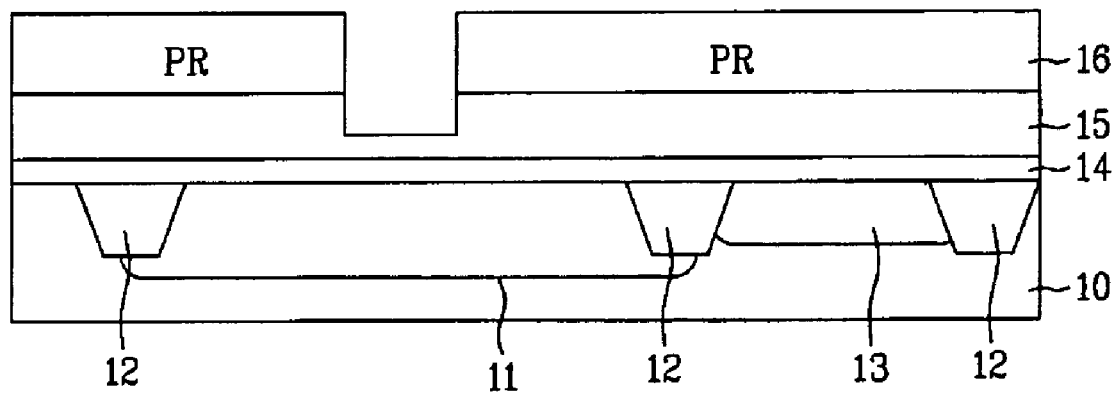

Referring to FIG. 1C, a first photoresist 16 is coated on the first insulation layer 15, and the first photoresist 16 thus coated is patterned using exposure and development processes such that the a portion of the first insulation layer 15 corresponding to a gate electrode forming region in the first region is exposed.

Afterward, the portion of the first insulation layer 15 is removed by a thickness of 250~350 Å using the first photoresist as a mask to a thickness of 150~250 Å.

Figure 1D:
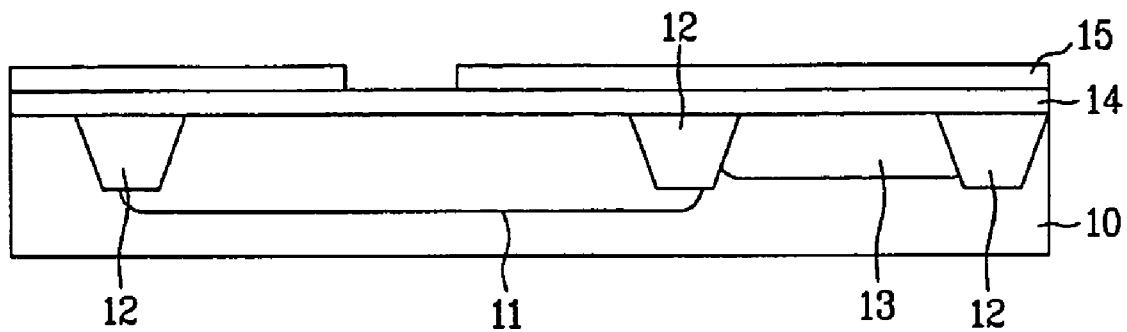

Referring to FIG. 1D, after the first photoresist 16 is removed, the first insulation layer 15 is etched by a target thickness of 150~250 Å to expose a portion of the buffer insulation layer 14 in the first region by being immersed in a $H_3PO_4$ solution.

Figure 1E:
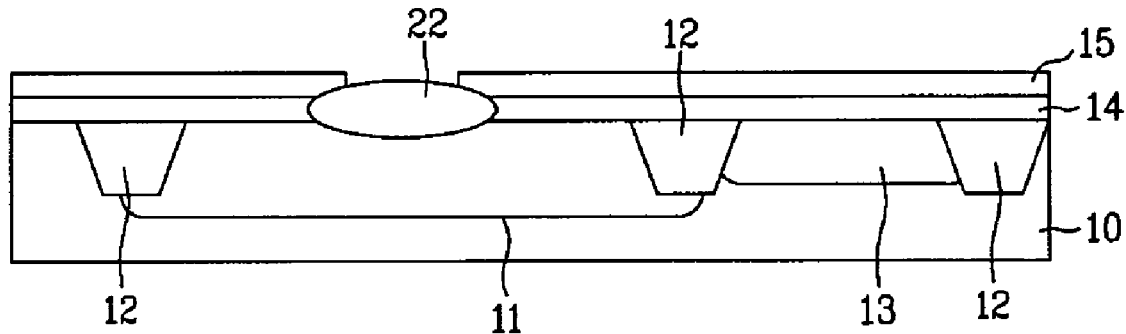

Referring to FIG. 1E, an exposed portion of the buffer insulation layer 14 in the first region is removed by a target thickness of 100~200 Å or more to expose the first well 11 of the semiconductor substrate 10 by being immersed in a HF solution using the first insulation layer 15 as a mask.

Then, a selective thermal oxidation is performed using the first insulation layer 15 as a mask so as to form a second insulation layer 22 having a thickness of 350~450 Å. At this time, the second insulation layer 22 is formed to have a local oxidation of silicon (LOCOS) shape, and to be wider than a first gate electrode 19a in the first region, which will be formed in a subsequent process.

The removing of the exposed portion of the buffer insulation layer 14 in a HF solution by a target thickness of 100~200 Å or more is intended for completely removing the exposed portion of the buffer insulation layer 14 because a thickness of the exposed portion of the buffer insulation layer 14 ranges 100 Å to 200 Å.

Although the second metal layer 22 has a thickness of 350~450 Å by a thermal oxidation when the buffer insulation layer 14 has a thickness of 100~200 Å according to an embodiment of the present invention, the present invention is not limited thereto, but instead, the second metal layer 22 and the buffer insulation layer 14 may also have any other thickness while maintaining the proportional relationship.

Figure 1F:
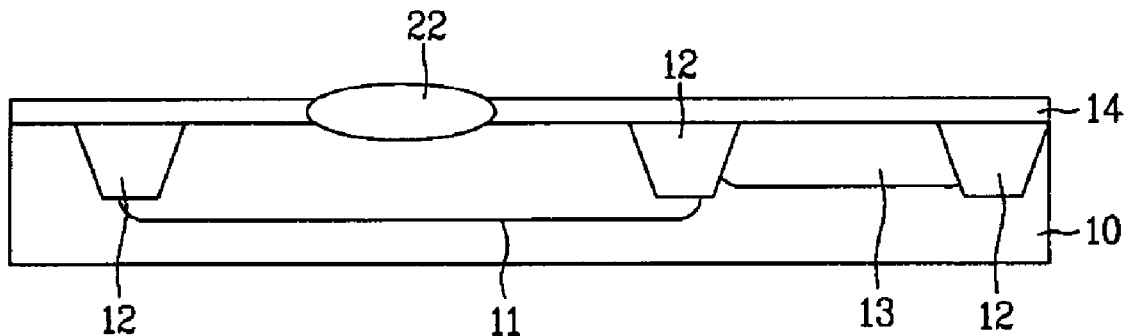

Referring to FIG. 1F, the first insulation layer 15 is immersed in a $H_3PO_4$ solution and removed by a target thickness of 250~350 Å or more so that the buffer insulation layer 14 is exposed.

Figure 1G:
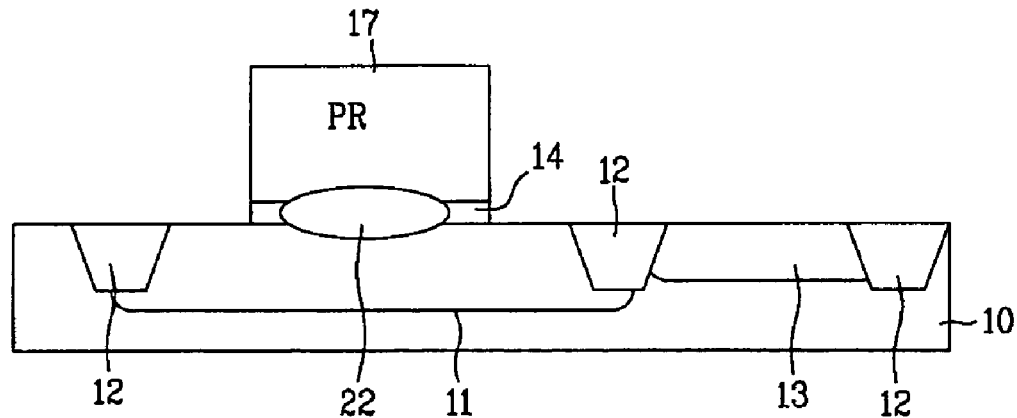

Referring to FIG. 1G, a second photoresist 17 is coated on an entire surface of the semiconductor substrate 10 and the second photoresist 17 thus coated is selectively patterned such that the second photoresist 17 is wider than the second insulation layer in the first region using exposure and development processes.

Afterward, a portion of the buffer insulation layer 14 is removed by a target thickness of 100~200 Å or more to exposure a portion of the semiconductor substrate 10 including a portion of the first well 11 and the second well 13 by being immersed in a HF solution using the second photoresist 17 thus patterned as a mask.

Figure 1H:
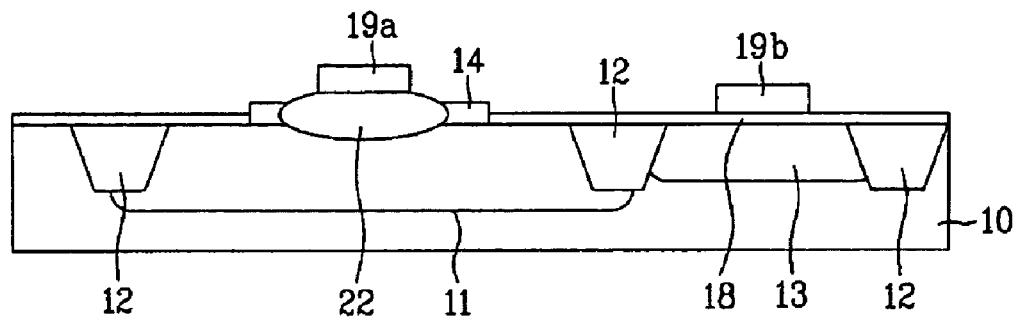

Referring to FIG. 1H, after removing the second photoresist 17, a third insulation layer 18 is formed thinner than-the buffer insulation layer 14 on the exposed surface of the semiconductor substrate 10 and the first and second wells 11 and 13, using a thermal oxidation. The third insulation layer 18 serves as a gate insulation layer in the second region.

Then, a polysilicon layer is deposited on the entire surface of the semiconductor substrate 10. Afterward, a first gate electrode 19a is formed on the second insulation layer 22 in the first region, and a second gate electrode 19b is formed on the second region using a gate forming mask.

At this time, because the third insulation layer 18 is formed not only in the second region but also in a portion of the first region adjacent to the second region, the thickness of the third insulation layer 18 is the same in the second region and in the portion of the first region (source and drain forming regions). Therefore, it is possible to etch the third insulation layer to the same target depth in the second region and the portion of the first region for forming the first and second gate electrodes 19a and 19b. It is also possible to prevent an occurrence of damages in the trench isolation layer and in the second region of the substrate, which is an LV device forming region.

Also, source and drain regions, although not shown, are formed both in the first well 11 at both lateral sides of the first gate electrode 19a and in the second well 13 at both lateral sides of the second gate electrode 19b.

Figure 1I:
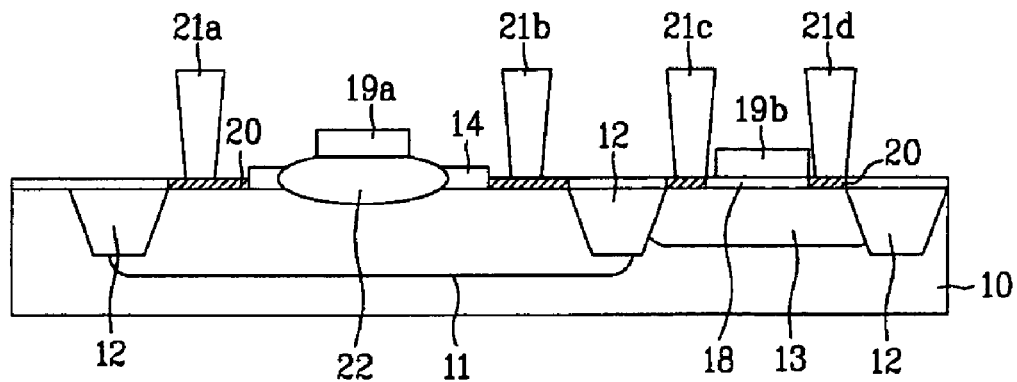

Referring to FIG. 1I, a metal layer is deposited and annealed on an entire surface of the substrate including the source and drain regions to form salicide layers 20 on surfaces of the source and drain regions.

Afterward, a first source electrode 21a and a first drain electrode 21b are respectively formed on the source and drain regions in the first region, where the salicide layers are formed. And a second source electrode 21c and a second drain electrode 21d are respectively formed on the source and drain regions in the second region.

As described above, a first transistor including the first gate electrode 19a, the source and drain regions, the salicide layers 20 in the source and drain regions, the first source electrode 21a and the first drain electrode 21b is formed in the first region. And a second transistor including the second gate electrode 19b, the source and drain regions, the salicide layers 20 in the source and drain regions, the second source electrode 21c and the second drain electrode 21d is formed in the second region.

Since portions of the third insulation layers where the salicide layers are formed, located in the first and second regions have the same thickness, it is possible to prevent an etch damage during the etching for forming source and drain regions.

The method for forming a semiconductor device according to the present invention has the following advantages.

First, as an insulation layer is formed to the same thickness in source and drain regions respectively formed in HV and LV device forming regions, the insulation layer may be etched by the same target depth during an etching for forming a first and a second gate electrode for each region. Thus, it is possible to prevent an occurrence of a damage in a second region of a substrate, which is the LV device forming region, to prevent a current leakage, and therefore, to increase the yield.

Second, portions of the insulation layers where the salicide layers are formed, located in the HV and LV device forming regions have the same thicknesses. Thus, it is possible to prevent an occurrence of an etch damage in the LV device forming region, to prevent a current leakage, and therefore, to increase the yield.

Third, a dual gate is formed by once performing depositing and etching processes of a polysilicon.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for forming a semiconductor device, the method comprising:

sequentially depositing a buffer insulation layer and a first insulation layer on a semiconductor substrate having a high voltage device region and a low voltage device region;

removing portions of the buffer insulation layer and the first insulation layer to expose a portion of the high voltage device region;

forming a second insulation layer thicker than the buffer insulation layer in the exposed portion of the high voltage device region;

selectively removing the first insulation layer and the buffer insulation layer from the low voltage device region and the high voltage device region, while masking the second insulation layer and a portion of the buffer insulation layer adjacent to the second insulation layer in the high voltage device region, to expose a portion of the high voltage device region and the entire low voltage device region;

forming a third insulation layer thinner than the buffer insulation layer in the low voltage region and on exposed substrate in the high voltage region; and forming transistor gates on the second insulation layer in the high voltage device region and on the third insulation layer in the low voltage device region.

2. The method according to claim 1, wherein removing portions of the buffer insulation layer and the first insulation layer comprises:

coating a first photoresist on the first insulation layer;

patterning the first photoresist such that a portion of the first insulation layer in the high voltage device region is exposed, using exposure and development processes;

etching the exposed portion of the first insulation layer by a predetermined depth using the first photoresist as a mask;

removing the first photoresist and blanket etching the first insulation layer to expose a corresponding portion of the buffer insulation layer; and removing the exposed portion of the buffer insulation layer using the first insulation layer as a mask.

3. The method according to claim 2, wherein the buffer insulation layer has a thickness of 100~200 Å, the first insulation layer has a thickness of 450~550 Å, and the exposed portion of the first insulation layer is etched to a thickness of 150~250 Å.

4. The method according to claim 2, wherein about 150~250 Å of the first insulation layer is blanket etched by immersing the substrate in a $H_3PO_4$ solution.

5. The method according to claim 1, wherein removing the exposed buffer insulation layer-comprises immersing the substrate in a HF solution.

6. The method according to claim 1, wherein the second insulation layer has a thickness of 350~450 Å, and is formed using a thermal oxidation process.

7. The method according to claim 6, wherein the thermal oxidation process comprises local oxidation of silicon (LOCOS).

8. The method according to claim 1, wherein selectively removing the first insulation layer and the buffer insulation layer comprises:

removing the first insulation layer to expose the buffer insulation layer;

coating a second photoresist on the buffer insulation layer;

patterning the second photoresist using exposure and development processes such that the patterned second photoresist covers the second insulation layer and has a greater width than that of the second insulation layer; and removing an exposed portion of the buffer insulation layer using the patterned second photoresist as a mask.

9. The method according to claim 8, wherein the first insulation layer is removed to a target thickness of 150~250 Å by immersion in a $H_3PO_4$ solution.

10. The method according to claim 8, wherein the buffer insulation layer is removed by 100~200 Å or more by immersion in a HF solution.

11. The method according to claim 1, wherein forming the transistor gates comprises:

depositing a polysilicon layer on the second and third insulating layers; and forming gate electrodes using a gate electrode forming mask in the high and low voltage device regions.

12. The method according to claim 11, further comprising forming source and drain regions at lateral sides of the gate electrodes.

13. The method according to claim 12, further comprising forming a salicide layer in the source and drain regions.

14. The method according to claim 13, further comprising forming source and drain electrodes to contact the salicide layer in the respective source and drain regions.

15. The method according to claim 1, wherein masking the second insulation layer and the portion of the buffer insulation layer comprises forming a patterned photoresist on the second insulation layer and the buffer insulation layer.

16. The method according to claim 15, wherein the patterned photoresist on the second insulation layer has a width greater than that of the second insulation layer.

* * * * *